(12) United States Patent
Li

(10) Patent No.: US 10,225,033 B2
(45) Date of Patent: Mar. 5, 2019

(54) PHYSICAL LAYER CIRCUIT, CLOCK RECOVERY CIRCUIT AND CALIBRATION METHOD OF FREQUENCY OFFSET

(71) Applicant: ALi Corporation, Hsinchu (TW)

(72) Inventor: Lin Li, Shanghai (CN)

(73) Assignee: ALI CORPORATION, Hsinchu (TW)

( * ) Notice: Subject to any disclaimer, the term of this patent is extended or adjusted under 35 U.S.C. 154(b) by 0 days.

(21) Appl. No.: 15/823,796

(22) Filed: Nov. 28, 2017

(65) Prior Publication Data

US 2019/0013888 A1    Jan. 10, 2019

(30) Foreign Application Priority Data

Jul. 7, 2017   (CN) .......................... 2017 1 0551927

(51) Int. Cl.
| | |
|---|---|
| H03L 7/08 | (2006.01) |
| H03L 7/00 | (2006.01) |
| H04J 3/06 | (2006.01) |
| H04L 7/04 | (2006.01) |
| H03L 7/091 | (2006.01) |
| H04L 12/70 | (2013.01) |

(52) U.S. Cl.
CPC .............. H04J 3/0688 (2013.01); H03L 7/00 (2013.01); H03L 7/08 (2013.01); H03L 7/0807 (2013.01); H03L 7/091 (2013.01); H04L 7/04 (2013.01); H04L 2012/5674 (2013.01)

(58) Field of Classification Search
USPC .. 375/219, 220, 222, 229–236, 240, 240.26, 375/240.27, 240.28, 240.29, 259, 285, 375/284, 278, 293, 294, 295, 306, 307, 375/316, 326, 327, 346, 347, 350, 354, 375/371, 373, 374, 376, 375
See application file for complete search history.

(56) References Cited

U.S. PATENT DOCUMENTS

| | | | | |
|---|---|---|---|---|
| 4,203,075 A | * | 5/1980 | Wessler | ..................... H03L 7/06 331/1 A |
| 4,595,953 A | * | 6/1986 | Willis | ................ H04N 5/44504 348/516 |
| 5,233,425 A | * | 8/1993 | Rabii | ...................... H03J 7/065 348/731 |

(Continued)

*Primary Examiner* — Linda Wong
(74) *Attorney, Agent, or Firm* — McClure, Qualey & Rodack, LLP

(57) ABSTRACT

A physical layer circuit of a receiver, a clock recovery circuit and a calibration method of frequency offset are provided. The physical layer circuit includes an equalizer and a clock recovery circuit. The equalizer generates an equalized sampling signal corresponding to a sampling clock signal. The clock recovery circuit includes a phase detector, a loop filter, a free wheel circuit, an output circuit and a controller. The phase detector calculates phase differences according to the equalized sampling signal. The loop filter generates loop pulses according to the phase differences. The free wheel circuit generates free wheel pulses. The output circuit receives the loop pulses and the free wheel pulses and generates corresponding phase-shifting pulses for adjusting the sampling clock signal. The controller calculates an accumulative correction offset according to the phase-shifting pulses, and the free wheel circuit periodically generates the free wheel pulses accordingly.

19 Claims, 8 Drawing Sheets

(56) References Cited

U.S. PATENT DOCUMENTS

| | | | | |
|---|---|---|---|---|
| 5,777,967 A * | 7/1998 | Ishibashi | G11B 7/00375 | 369/59.2 |
| 5,991,350 A * | 11/1999 | Yamamoto | H03L 7/085 | 375/327 |
| 6,229,857 B1 * | 5/2001 | Wagner | H04B 15/00 | 375/316 |
| 6,285,726 B1 * | 9/2001 | Gaudet | H04L 7/0025 | 327/156 |
| 6,522,366 B1 * | 2/2003 | Onodera | H04N 9/66 | 348/638 |
| 6,650,718 B1 * | 11/2003 | Fujimura | H04L 7/0334 | 375/355 |
| 6,738,922 B1 * | 5/2004 | Warwar | H03L 7/081 | 713/500 |
| 7,102,398 B1 * | 9/2006 | Chiu | H03L 7/07 | 327/147 |
| 7,307,562 B2 * | 12/2007 | Bucklen | H03M 1/1245 | 341/122 |
| 7,868,949 B2 * | 1/2011 | Moehlmann | H03L 7/087 | 327/156 |
| 8,130,891 B2 * | 3/2012 | Kim | H03L 7/0814 | 375/375 |
| 8,368,435 B2 * | 2/2013 | Talaga, Jr. | H03L 7/0814 | 327/147 |
| 8,837,626 B2 * | 9/2014 | Malipatil | H04L 25/0307 | 375/233 |
| 9,219,600 B1 * | 12/2015 | Landon | H04L 7/0016 | |
| 9,853,633 B1 * | 12/2017 | Cheng | H03K 5/1506 | |
| 2003/0123582 A1 * | 7/2003 | Kim | H04B 7/0848 | 375/347 |
| 2003/0212947 A1 * | 11/2003 | Schenk | H04L 7/0062 | 714/786 |
| 2004/0027262 A1 * | 2/2004 | Cloetens | G11B 20/10009 | 341/123 |
| 2004/0161070 A1 * | 8/2004 | Yin | H04J 3/04 | 375/371 |
| 2004/0223568 A1 * | 11/2004 | Liu | H04L 7/007 | 375/355 |
| 2007/0096836 A1 * | 5/2007 | Lee | G04F 10/005 | 331/57 |
| 2008/0259656 A1 * | 10/2008 | Grant | H02M 3/33523 | 363/21.18 |
| 2009/0147897 A1 * | 6/2009 | Shin | H03L 7/00 | 375/355 |
| 2009/0244375 A1 * | 10/2009 | Moehlmann | H03L 7/087 | 348/512 |
| 2010/0039182 A1 * | 2/2010 | Galton | H03K 23/54 | 331/1 A |
| 2010/0134159 A1 * | 6/2010 | Jin | H03L 7/087 | 327/156 |
| 2010/0150290 A1 * | 6/2010 | Kim | H03L 7/0814 | 375/371 |
| 2010/0237922 A1 * | 9/2010 | Kwon | G06F 1/06 | 327/231 |
| 2010/0289544 A1 * | 11/2010 | Lee | H04L 7/0062 | 327/159 |
| 2012/0074997 A1 * | 3/2012 | Kim | H03L 7/081 | 327/157 |
| 2013/0136220 A1 * | 5/2013 | Lee | H03L 7/07 | 375/375 |
| 2013/0251084 A1 * | 9/2013 | Werner | H03D 13/004 | 375/375 |
| 2014/0098843 A1 * | 4/2014 | Kong | G01R 31/31709 | 375/219 |
| 2014/0146933 A1 * | 5/2014 | Lee | H04L 7/0331 | 375/376 |
| 2014/0184281 A1 * | 7/2014 | Danny | H03L 7/081 | 327/115 |
| 2014/0266459 A1 * | 9/2014 | Scott | H03F 3/195 | 330/294 |
| 2015/0280857 A1 * | 10/2015 | Bianciotto | H04B 10/614 | 398/65 |
| 2016/0012846 A1 * | 1/2016 | Wilson | G11B 5/09 | 360/46 |
| 2016/0043860 A1 * | 2/2016 | Tu | H03L 7/087 | 375/371 |
| 2016/0077193 A1 * | 3/2016 | Chu | H03L 7/08 | 342/195 |
| 2016/0164704 A1 * | 6/2016 | Giaconi | H04L 7/0041 | 375/233 |
| 2016/0248431 A1 * | 8/2016 | Luo | G06F 1/04 | |
| 2017/0019206 A1 * | 1/2017 | Bianciotto | H04B 10/614 | |
| 2017/0077933 A1 * | 3/2017 | Zhang | H03L 7/0807 | |
| 2017/0331483 A1 * | 11/2017 | Hossain | H03L 7/235 | |
| 2018/0013434 A1 * | 1/2018 | Amirkhany | H03L 7/0807 | |
| 2018/0083809 A1 * | 3/2018 | Tajalli | H04L 25/40 | |
| 2018/0123776 A1 * | 5/2018 | Azenkot | H04L 25/03885 | |

\* cited by examiner

US 10,225,033 B2

PHYSICAL LAYER CIRCUIT, CLOCK RECOVERY CIRCUIT AND CALIBRATION METHOD OF FREQUENCY OFFSET

This application claims the benefit of People's Republic of China application Serial No. 201710551927.8, filed Jul. 7, 2017, the subject matter of which is incorporated herein by reference.

BACKGROUND OF THE INVENTION

Field of the Invention

The invention relates in general to a physical layer circuit, a clock recovery circuit and a calibration method of frequency offset, and more particularly to the physical layer circuit, the clock recovery circuit and the calibration method of frequency offset for a receiver.

Description of the Related Art

Please refer to FIG. 1, which shows a schematic diagram of signal transmission in a communication system. The transmitter 11 transmits signals Str to the receiver 15 via the channel 13. Since the channel 13 is likely to be affected by noises, received signals Srv are usually accompanied with inter-symbol interference (ISI) after the signals Str are transmitted through the channel 13. Furthermore, clock signals for the transmitter 11 and the receiver 15 are not synchronous.

For example, the standard for Gigabit Ethernet specifies a reference frequency of 125 MHz. Therefore, clock signals provided to circuits of the transmitter 11 and the receiver 15 should comply with the frequency of 125 MHz, that is, a clock period of 8 ns. In practice, the frequency of most clock signals in the transmitter 11 and the receiver 15 is not exactly 125 MHz as required. Therefore, frequency tolerance is defined and specified in communication systems.

If there is a difference $\Delta f1$ between the transmitting frequency ftr of the transmitter 11 and the reference frequency fc, the frequency (that is, transmitting frequency ftr) of the clock signal in the transmitter 11 may range from (fc−$\Delta f1$) to (fc+$\Delta f1$). If there is a difference $\Delta f2$ between the receiving frequency frv of the receiver 15 and the reference frequency fc, the frequency (that is, receiving frequency frv) of the clock signal in the receiver 15 may range from (fc−$\Delta f2$) to (fc+$\Delta f2$). The reference frequency, for example, is 125 MHz as specified above. Thus, the frequency offset may exist between the clock signals in the transmitter 11 and the receiver 15.

Please refer to FIG. 2, illustrating the frequency offset between the transmitting frequency ftr and the receiving frequency frv. In communication systems, the frequency offset is usually expressed in parts-per-million (ppm), wherein 1 ppm=$1\times10^{-6}$. If the difference $\Delta f1$ between the transmitting frequency ftr and the reference frequency fc is 50 ppm, and the difference $\Delta f2$ between the receiving frequency frv and the reference frequency fc is 100 ppm, the maximum frequency difference Max$\Delta f$ between the transmitting frequency ftr and the receiving frequency frv may reach 150 ppm, that is, Max$\Delta f=|\Delta f1|+|\Delta f2|$.

Therefore, because there may be error in one or both of the transmitting frequency ftr and the receiving frequency frv, the frequency offset phenomenon occurs between the transmitted signals Str and the received signals Srv so as to affect the processing of the received signals Srv. It is an important issue to reduce the influence of the frequency offset so that the receiver can recover the received signals Srv quickly and accurately.

SUMMARY OF THE INVENTION

The invention is directed to a clock recovery circuit, a physical layer circuit and a calibration method of frequency offset. The physical layer circuit and the calibration method of frequency offset of the present invention can efficiently compensate the large frequency offset occurring in the local clock signal. Furthermore, the analog-to-digital converter, the equalizer and the clock recovery circuit of the physical layer circuit can enter in the stable state rapidly.

According to an aspect of the present invention, a clock recovery circuit is provided. The clock recovery circuit includes a phase detector, a loop filter, a free wheel circuit, an output circuit and a controller. The phase detector receives an equalized sampling signal sampled based on a sampling clock signal to calculate a plurality of phase differences in a plurality of time windows. The loop filter is electrically connected to the phase detector, for correspondingly generating loop pulses according to the phase differences generated by the phase detector in the time windows. The free wheel circuit generates free wheel pulses. The output circuit is electrically connected to the loop filter and the free wheel circuit, for receiving the loop pulses and the free wheel pulses and correspondingly generating a plurality of phase-shifting pulses according to the loop pulses and the free wheel pulses. The controller is electrically connected to the free wheel circuit and the output circuit, for calculating a first accumulative correction offset according to the phase-shifting pulses generated in a previous time window. The free wheel circuit periodically generates the free wheel pulses according to the first accumulative correction offset during a current time window next to the previous time window. The sampling clock signal is adjusted according to the phase-shifting pulses generated by the output circuit According to another aspect of the present invention, a physical layer circuit is provided. The physical layer circuit includes an equalizer and the above-described clock recovery circuit. The equalizer equalizes the digital received signal generated by sampling based on a sampling clock signal, and generates the equalized sampling signal to be transmitted to the clock recovery circuit for processing as described above.

According to still another aspect of the present invention, a calibration method of frequency offset applied to a physical layer circuit of a receiver is provided. The calibration method of frequency offset includes steps of: equalizing a digital received signal generated by sampling based on a sampling clock signal to generate an equalized sampling signal; calculating a plurality of phase differences in a plurality of time windows according to the equalized sampling signal and generating a plurality of loop pulses correspondingly; periodically generating a plurality of free wheel pulses during a current time window of the time windows according to a first accumulative correction offset; generating a plurality of phase-shifting pulses correspondingly according to the loop pulses and the free wheel pulses; and adjusting the sampling clock signal according to the phase-shifting pulses. The first accumulative correction offset is calculated according to the phase-shifting pulses generated in a previous time window prior to the current time window.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
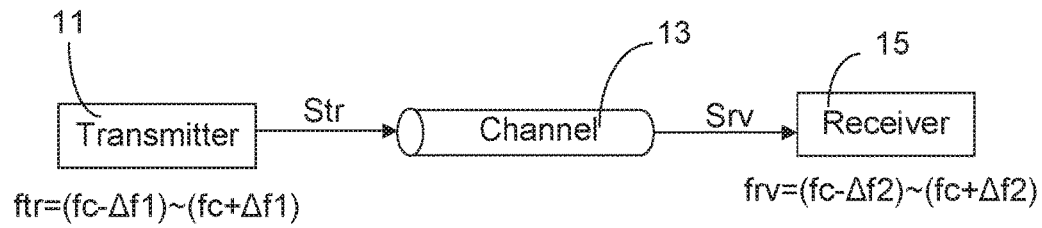
FIG. 1 (Prior Art) is a schematic diagram showing signal transmission in a communication system.
Figure 2:
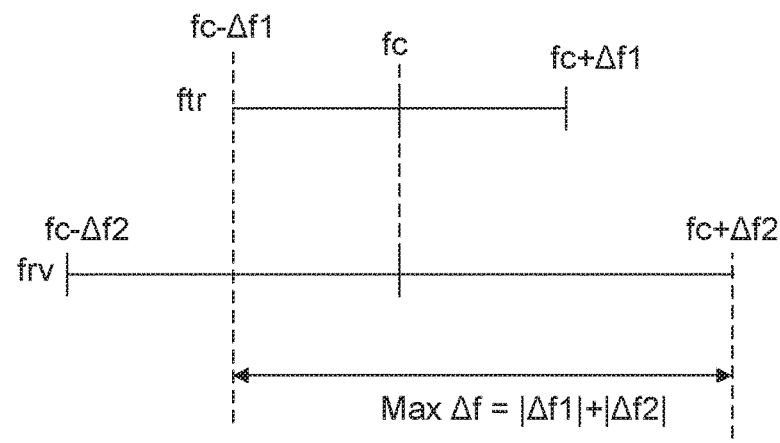
FIG. 2 (Prior Art) is a schematic diagram showing a frequency offset between the transmitting frequency and the receiving frequency.
Figure 3:
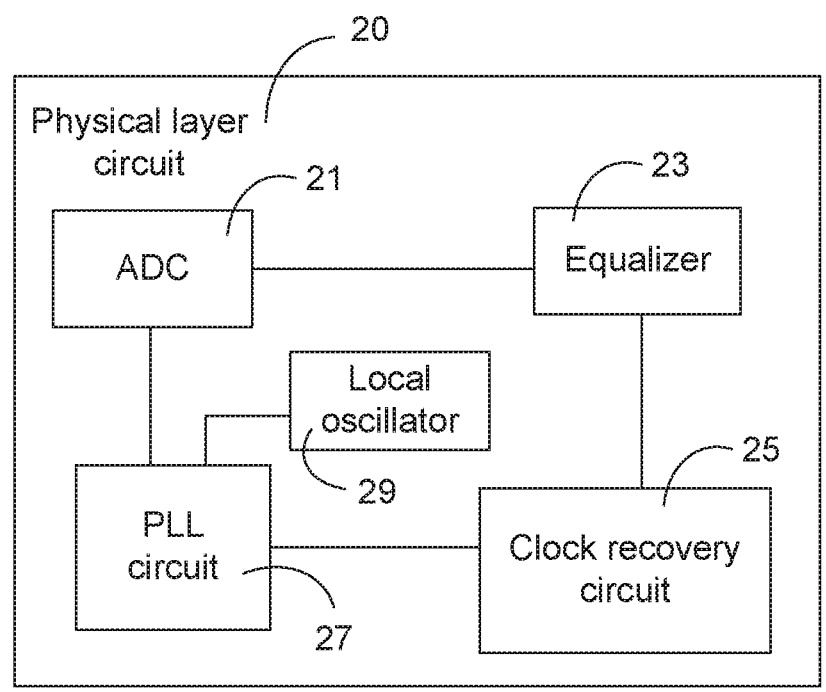
FIG. 3 is a block diagram illustrating a physical layer circuit of a receiver according to an embodiment of the present invention.

Please refer to FIG. 3, a block diagram illustrating a physical layer circuit of a receiver according to an embodiment of the present invention. In the embodiment, the physical layer circuit 20 includes an analog-to-digital converter (hereinafter referred as to ADC) 21, an equalizer 23, a clock recovery circuit 25 and a phase-locked loop circuit (hereinafter referred as to PLL circuit) 27. The ADC 21 is electrically connected to the equalizer 23 and the PLL circuit 27. The clock recovery circuit 25 is also electrically connected to the equalizer 23 and the PLL circuit 27. The physical layer circuit 20 may further include a local oscillator 29 electrically connected to the PLL circuit 27. The local oscillator 29 provides a local clock signal CLKloc to the PLL circuit 27. Sometimes, the local oscillator 29 is not located inside the physical layer circuit 20. The receiver described in the specification may be an Ethernet receiver or a Gigabit Ethernet receiver.

In FIG. 3, the clock recovery circuit 25 receives signals from the equalizer 23, and the equalizer 23 receives signals from the ADC 21. The clock recovery circuit 25 estimates the timing error of the clock signal according to the signals from the equalizer 23 and adjusts the sampling clock signals CLKsam to be transmitted to the ADC 21. The ADC 21 uses the sampling clock signal CLKsam to sample the received signals Srv to achieve clock synchronization of the transmitter and the receiver. Because the frequency of the local clock signal CLKloc generated by the local oscillator 29 is fixed, the clock recovery circuit 25 should generate and transmit an adjusting signal to the PLL circuit 27 correspondingly according to the estimated timing error. Besides, the PLL circuit 27 generates the sampling clock signal CLKsam according to the adjusting signal from the clock recovery circuit 25 and the local clock signal CLKloc generated by the local oscillator 29, and transmits the sampling clock signal CLKsam to the ADC 21 and other circuits of the receiver, so that each circuit in the receiver operates based on the sampling clock signal CLKsam. Hence, the equalizer 23 and the clock recovery circuit 25 operate based on the sampling clock signal CLKsam after the adjustment performed by the PLL circuit 27.

If the equalizer 23 can not eliminate channel interference and converge within a specified time period, the error rate of the signal transmitted to the clock recovery circuit 25 may become too high to accurately estimate the timing error of the signal, even failing to converge for a long time. If the clock recovery circuit 25 can not converge successfully, the sampling clock signal CLKsam with greater sampling deviation is received by the ADC 21, and the greater sampling deviation has an adverse effect on convergence tendency of the equalizer 23, thus producing a vicious circle. The problem even affects decoding of the received signal Srv in later procedure. In brief, each of the ADC 21, the equalizer 23 and the clock recovery circuit 25 affects the normal operation of the other two.

As described above, there is timing error in the clock signal in the transmitter and/or the receiver. Therefore, the clock period of the local clock signal CLKloc in the receiver is usually different from the clock period of the transmitting clock signal CLKtr in the transmitter. Such mismatch also results in phase difference between the local clock signal CLKloc and the transmitting clock signal CLKtr.

The clock recovery circuit 25 usually includes a phase detector and a loop filter to detect the phase difference and to calibrate the frequency offset so as to eliminate the clock asynchronization influence. However, if there is a large initial frequency offset (for example, greater than 150 ppm) between the local clock signal CLKloc and the transmitting clock signal CLKtr, relatively great noise would be introduced as the clock recovery circuit 25 tries to estimate the large frequency offset. Hence, the phase difference estimated by the phase detector would be difficult to be accurate and consequently the ADC 21 and the equalizer 23 can not acquire accurate signals for processing. Thus, the equalizer 23 cannot eliminate the channel interference and inaccurate signals are transmitted to the clock recovery circuit 25 for frequency offset calibration, resulting in a vicious spiral. Therefore, the use of the phase detector and the loop filter is not enough to quickly and accurately estimate and calibrate the large initial frequency offset, even failing to achieve clock synchronization between the transmitter and the receiver.

In view of the above problems, the clock recovery circuit 25 of the present invention proposes that not only the phase difference estimated by the phase detector is used to calibrate the frequency offset between the local clock signal CLKloc and the transmitting clock signal CLKtr, accumulation of the calculated frequency offset is also taken into consideration for automatic calibration. By means of this operation, the residual frequency offset can be effectively reduced to make the error in the phase difference estimated by the phase detector becomes smaller and smaller. Therefore, even though there is a large initial frequency offset between the clock signals in the transmitter and the receiver, the clock recovery circuit 25 can calibrate the frequency offset quickly and accurately so that the clock recovery circuit 25 and the equalizer 23 can converge much efficiently to prompt clock synchronization between the transmitter and the receiver.

Figure 4:
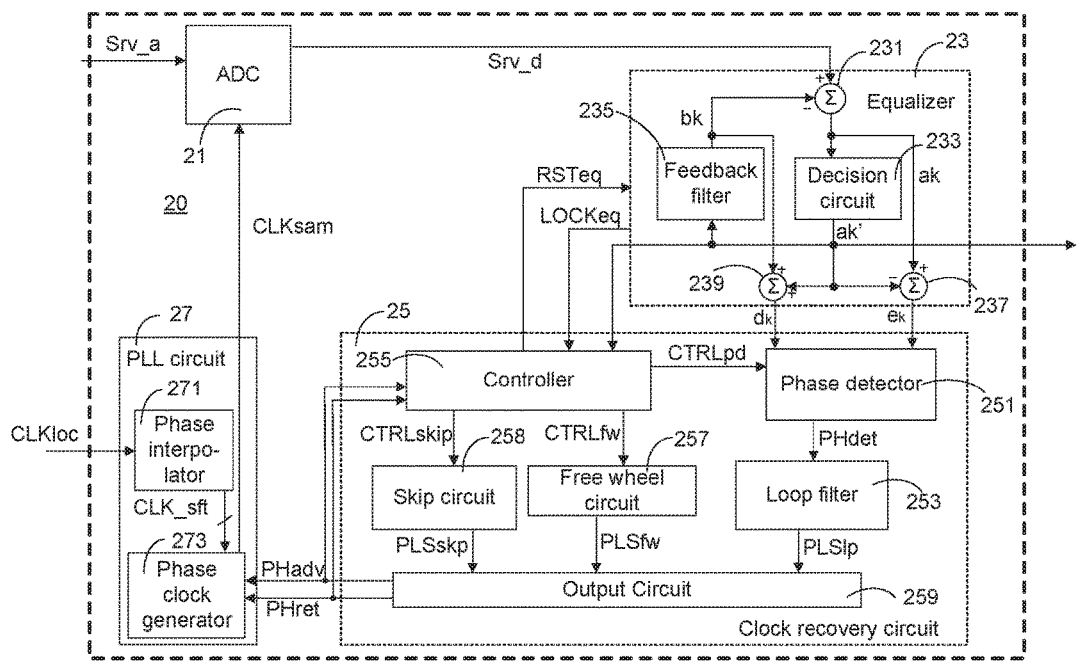
FIG. 4 is a block diagram illustrating elements of the physical layer circuit of the receiver of FIG. 3.

Please refer to FIG. 4, which shows a block diagram illustrating elements of the physical layer circuit of the receiver of FIG. 3. After the ADC 21 receives an analog received signal Srv_a from the transmitter, a digital received signal Srv_d is generated by sampling the received signal Srv_a based on the sampling clock signal CLKsam provided by the PLL circuit 27 and then transmitted to the equalizer 23. The equalizer 23 performs equalization of the digital received signal Srv_d to eliminate the channel interference in the digital received signal Srv_d. Then, the equalizer 23 generates and transmits an equalized sampling signal to the clock recovery circuit 25 for estimation and calibration of the frequency offset. The clock recovery circuit 25 can further generates and transmits a phase-shifting pulse to the PLL circuit 27. The phase-shifting pulse may be a phase-lead pulse PHadv or a phase-lag pulse PHret to lead-shift or lag-shift the phase. The sampling clock signal CLKsam is adjusted in response to the phase-shifting pulse.

The equalizer 23 of the present invention may further include adders 231, 237, 239, a decision circuit 233 and a feedback filter 235. The adder 231 is electrically connected to the ADC 21, the decision circuit 233 and the feedback filter 235. The adder 231 generates an anterior decision signal ak by subtracting the feedback filter signal bk generated by the feedback filter 235 from the digital received signal Srv_d generated by the ADC 21. The decision circuit 233 receives the anterior decision signal ak from the adder 231 and generates a posterior decision signal ak' according to the anterior decision signal ak. The adder 237 is electrically connected to the decision circuit 233 and the phase detector 251. The adder 237 receives the anterior decision signal ak and the posterior decision signal ak' from the decision circuit 233, and generates and transmits a decision error ek to the phase detector 251. The feedback filter 235 generates the feedback filter signal bk by filtering the posterior decision signal ak'. The adder 239 is electrically connected to the decision circuit 233 and the feedback filter 235. The adder 239 receives the posterior decision signal ak' and the feedback filter signal bk from the decision circuit 233 and the feedback filter 235, respectively, and then generates a recovered received signal dk according to the posterior decision signal ak' and the feedback filter signal bk. People skilled in the art may alternatively call the above-mentioned anterior decision signal and posterior decision signal as the soft decision signal and hard decision signal, respectively.

The difference between the recovered received signal dk and the digital received signal Srv_d is determined according to the sampling clock signal CLKsam. When the equalizer 23 has converged, the difference between the recovered received signal dk and the digital received signal Srv_d would be equal to the decision error ek between the anterior decision signal ak and the posterior decision signal ak'. Therefore, when the equalizer 23 converges, the decision error ek is affected by the sampling clock signal CLKsam. Hence, the decision error ek between the anterior decision signal ak and the posterior decision signal ak' reflects the status of the sampling clock signal CLKsam. For example, the phase difference between the current sampling clock signal CLKsam and the transmitting clock signal CLKtr may be obtained according to the decision error ek. In the embodiment, the equalized sampling signal generated by the equalizer 23 may include the recovered received signal dk and the decision error ek.

The internal elements and the operation of the clock recovery circuit 25 are described herein. In the embodiment, the clock recovery circuit 25 may further includes the phase detector 251, a loop filter 253, a controller 255, a free wheel circuit 257, a skip circuit 258 and an output circuit 259. The controller 255 is electrically connected to the phase detector 251, the free wheel circuit 257, the skip circuit 258 and the output circuit 259. The output circuit 259 is electrically connected to the loop filter 253, the free wheel circuit 257 and the skip circuit 258.

The phase detector 251 is electrically connected to the equalizer 23. The phase detector 251 continuously receives the equalized sampling signal from the equalizer 23 to calculate the phase difference between the current sampling clock signal CLKsam and the transmitting clock signal CLKtr to generate a phase difference signal PHdet. The phase detector 251 transmits the phase difference signal PHdet to the loop filter 253. The loop filter 253 being electrically connected to the phase detector 251 filters out the noise in the phase difference signal PHdet and compares the phase difference signal PHdet with a predetermined value. If the loop filter 253 determines that the phase difference corresponding to the phase difference signal PHdet is greater than the predetermined value, the loop filter 253 will generate and transmit a loop pulse PLSlp (for example, a loop-lead pulse or a loop-lag pulse) to the output circuit 259. It is to be noted that the present invention does not limit how the phase detector 251 generates the phase difference signal PHdet and how the loop filter 253 generates the loop pulse PLSlp. Furthermore, for clear description, the frequency offset calibrated according to the loop pulse PLSlp generated by the loop filter 253 together with the phase detector 251 is called a loop correction offset PHlp.

The controller 255 controls the phase detector 251 and the free wheel circuit 257. The controller 255 is electrically connected to the output circuit 259. The controller 255 calculates the frequency offset of each time window according to the phase-shifting pulse (for example, the phase-lead pulse PHadv, the phase-lag pulse PHret or combination of both) generated by the output circuit 259.

The controller 255 may calculate the accumulative correction offset PHacc (in ppm) of each time window by the following Equation (1) according to the number of the phase-lead pulses N_PHadv during the time window, the number of the phase-lag pulses N_PHret during the time window, the number of the phase step N_step (for example, 64 or 128) and the time length of the time window Ttw (for example, 0.5 ms).

$$PHacc = \frac{(N\_PHret - N\_PHadv)/N\_step}{Ttw} \times 10^6 \qquad \text{Equation (1)}$$

The controller 255 can generate a free wheel control signal CTRLfw to enable the free wheel circuit 257 and transmit the accumulative correction offset PHacc to the free wheel circuit 257. The free wheel circuit 257 periodically generates and transmits a free wheel pulse PLSfw (for example, free wheel lead pulse or free wheel lag pulse) to the output circuit 259 according to the accumulative correction offset PHacc.

In another embodiment, the controller 255 further controls the equalizer 23. Concretely, in addition to the equalized sampling signal, the equalizer 23 further transmits the posterior decision signal ak' to the controller 255. The controller 255 decides whether the output of the equalizer 23 is normal according to the posterior decision signal ak'. If the output of the equalizer 23 is considered not as normal output, the controller 255 generates an equalizer reset signal RSTeq to the equalizer 23 to restart the equalizer 23. The operation related to the equalizer 23 and the controller 255 will be described later.

In the embodiment, the output circuit 259 may be implemented by a logic OR gate for receiving the pulses generated by the loop filter 253 and the free wheel circuit 258 in different conditions. The output circuit 259 will generate the phase-lead pulse PHadv or the phase-lag pulse PHret to make the PLL circuit 27 adjust the sampling clock signal CLKsam correspondingly.

If the frequency offset between the transmitter and the receiver is larger, the phase difference estimated by the phase detector 251 will involve greater error, and the capability of the frequency offset calibration is affected. As described above, using only the loop correction offset PHlp generated by the loop filter 253 together with the phase detector 251 to calibrate the large frequency offset will adversely affect the convergence tendency of the clock recovery circuit 25 and the equalizer 23, and clock synchronization can not be achieved. According to an embodiment of the present invention, the free wheel circuit 257 is used to enhance the capability and speed of frequency offset calibration of the clock recovery circuit 25.

Therefore, the output circuit 259 further receives a free wheel pulse PLSfw from the free wheel circuit 257. After a certain clock cycles, the phase difference due to the frequency offset is accumulated to reach one phase step PHstep. At this time, the free wheel pulse PLSfw will eliminate the phase difference with one phase step PHstep in a reversed direction.

Even if the local clock signal CLKloc and the transmitting clock signal CLKtr have the same phase in the beginning, the phase difference due to the frequency offset continuously increases after certain clock cycles when the frequency offset calibration cannot catch up with the phase difference increments. According to the concept of the present invention, once the phase difference is accumulated to a certain degree (for example, greater or equal to one phase step PHstep), the free wheel circuit 257 correspondingly generates and transmits a free wheel pulse PLSfw to the output circuit 259 to make the output circuit 259 generate the phase-lead pulse PHadv or the phase-lag pulse PHret. By this adjustment, the burden of calculating the phase difference on the phase detector 251 may be reduced, which is advantageous to the phase detector 251 for effective approximation of the actual frequency offset.

In another embodiment, the controller 255 may further generate a skip control signal CTRLskip for controlling the skip circuit 258 to generate and transmit a skip pulse PLSskp (for example, a skip-lead pulse or a skip-lag pulse) to the output circuit 259. Therefore, the output circuit 259 may generate and transmit the pulse to the PLL circuit 27 not only according to any output of the loop filter 253 and the free wheel circuit 257 but the output of the skip circuit 258. In addition, when the output circuit 259 receives the skip-lead pulse, the output circuit 259 would generate and transmit the phase-lead pulse PHadv to the PLL circuit 27. Otherwise, when the output circuit 259 receives the skip-lag pulse, the output circuit 259 would generate and transmit the phase-lag pulse PHret to the PLL circuit 27.

In an embodiment, the PLL circuit 27 may further includes a phase interpolator 271 and a phase clock generator 273 electrically connected to each other. The phase interpolator 271 may be electrically connected to a local oscillator (not shown in FIG. 4) to receive the local clock signal CLKloc from the local oscillator. The phase clock generator 273 is electrically connected to the output circuit 259 and the ADC 21. The PLL circuit 27 shifts the local clock signal CLKloc according to the phase-lead pulse PHadv or the phase-lead pulse PHret generated by the output circuit 259, and generates a shifted clock signal CLKsft serving as a new sampling clock signal CLKsam to be provided to the ADC 21. For example, when the PLL circuit 27 receives the phase-lead pulse PHadv, the shifted clock signal CLKsft with one phase ahead of the current sampling clock signal CLKsam may be selected as the new sampling clock signal CLKsam. On the contrary, when the PLL circuit 27 receives the phase-lag pulse PHret, the shifted clock signal CLKsft with one phase behind of the current sampling clock signal CLKsam may be selected as the new sampling clock signal CLKsam. The details of the phase interpolator 271 and the phase clock generator 273 will be given later with reference to FIG. 9 and FIG. 10, respectively.

Figure 5:
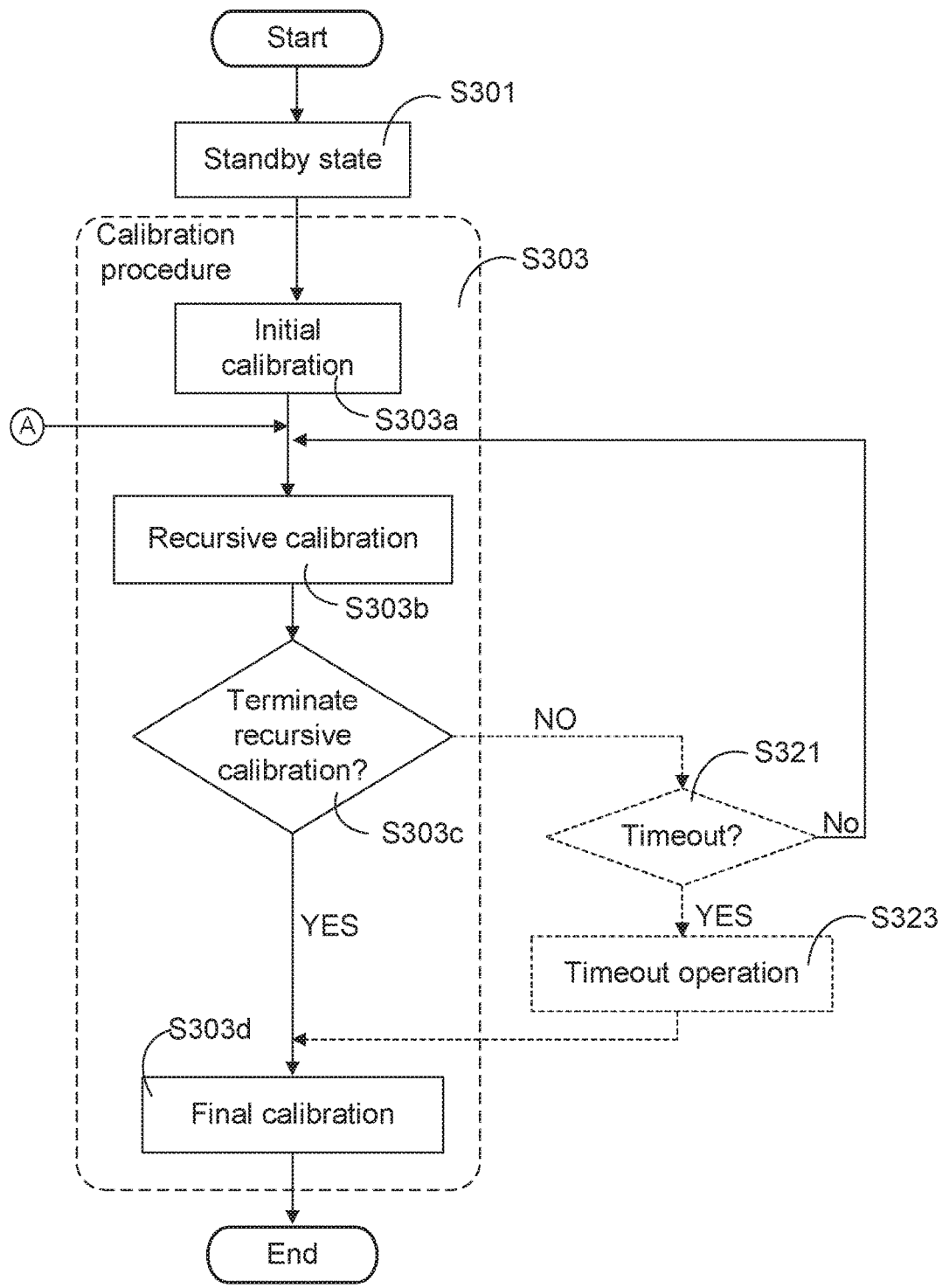
FIG. 5 is a flowchart illustrating a calibration method of frequency offset according to an embodiment of the present invention.

Please refer to FIG. 5, a flowchart illustrating a calibration method of frequency offset according to an embodiment of the present invention. Firstly, after the receiver is just actuated, the clock recovery circuit 25 is in a standby state (S301). Then, the clock recovery circuit 25 enters in a calibration state and performs a calibration procedure (S303). In other embodiments, the step S301 may be omitted. The step S303 further includes the following steps.

The calibration procedure (S303) includes steps of initial calibration (S303a) and recursive calibration (S303b). After each recursive calibration, the controller 255 decides whether a predetermined condition for terminating the recursive calibration is met or not (S303c). In an embodiment, the predetermined condition may be defined according to comparison of the estimated accumulative correction offset PHacc of two successive calibration intervals (hereinafter referred as a previous time window and a current time window). If the difference between the estimated accumulative correction offset PHacc1 estimated in the previous calibration interval and the estimated accumulative correction offset PHacc2 estimated in the current calibration interval is smaller than a predetermined difference threshold PHacc_th, it is defined that the predetermined condition is met, that is to say, the predetermined condition is met if |PHacc1−PHacc2|≤PHacc_th.

If the predetermined condition is met, in an embodiment, the clock recovery circuit 25 performs final calibration (S303d). The description of how the clock recovery circuit 25 performs the calibration will be given later with reference to FIG. 6, FIG. 7 and FIG. 8. If the decision in the step S303c is NO, the clock recovery circuit 25 repeatedly performs the recursive calibration (S303b).

In an embodiment, in the recursive calibration (S303b), the controller 255 can monitor whether the equalizer 23 functions normally according to the posterior decision signal ak' generated by the equalizer 23. The posterior decision signal ak' generated by the equalizer 23 may be one of three values, that is, −2, 2 and 0 at a ratio of about 1:1:2. If the output values are totally irrational, it shows that the equalizer 23 does not function normally, and the operation of the clock recovery circuit 25 may be affected so that the speed and the accuracy of estimation and calibration of the frequency offset are reduced. The controller 255 may monitor the output of the equalizer 23 by the following schemes. In an embodiment, the controller 255 continuously receives 1000 posterior decision signals ak' for example, and calculates the proportion of each value −2, 2 and 0 in the 1000 values. If the proportion of any one value is smaller than 10% for example, the controller 255 determines that the equalizer 23 does not function normally. In another embodiment, the controller 255 continuously receives 1000 posterior decision signals ak' for example, and counts the number of each value −2, 2 and 0 therein. If the number of any one value is smaller than 100 for example, the controller 255 determines that the equalizer 23 does not function normally. According to the decision, the controller 255 generates the equalizer reset signal RSTeq to reset the equalizer 23 to prevent the improper output of the equalizer 23 from affecting the frequency offset calibration.

Further, in another embodiment, the clock recovery circuit 25 may perform timeout operation. If the decision in the step S303c is NO, a further decision step is performed to decide whether a timeout condition is met (S321). If the timeout condition is not met, the procedure goes back to the step S303b; if the timeout condition is met, the clock recovery circuit 25 performs the timeout operation (S323). The clock recovery circuit 25 performs the final calibration (S303d) after the timeout operation (S323) The timeout operation will be described later with reference to FIG. 7.

Figure 6:
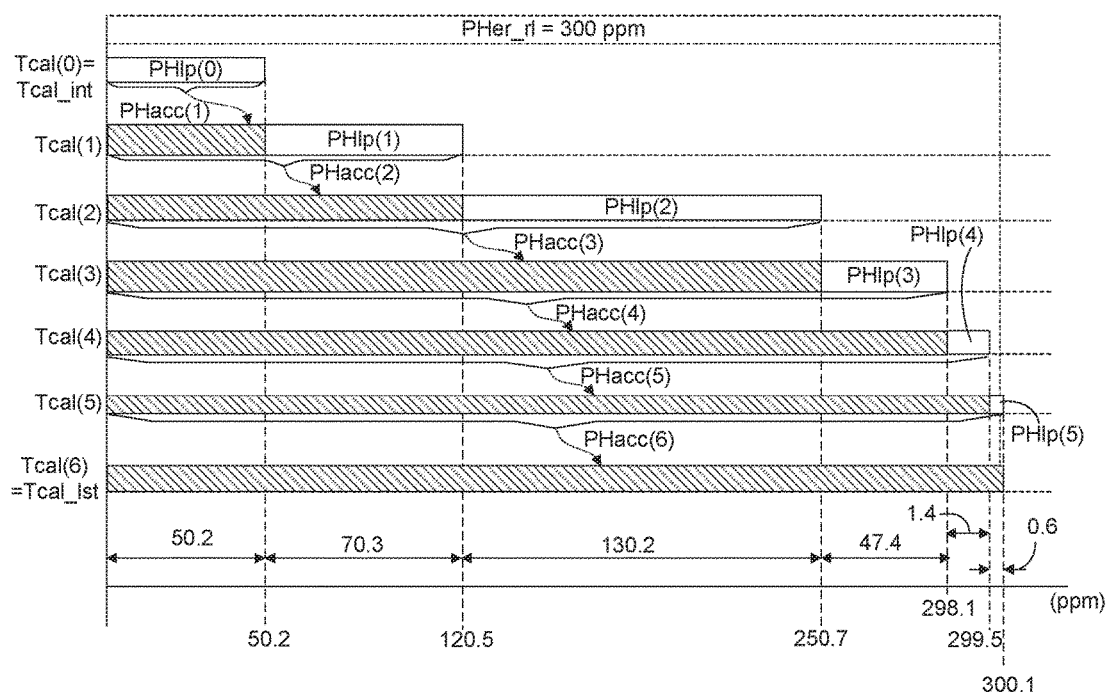
FIG. 6 is a schematic diagram showing frequency offset calibration progress during the calibration intervals according to the calibration method of frequency offset of the present invention.

Please refer to FIG. 6, a bar chart showing the accumulative correction offset of the calibration intervals when the clock recovery circuit 25 calibrates the frequency offset of a simulated signal. The bars show the change of the accumulative correction offset PHacc and the loop correction offset PHlp for calibrating the frequency offset of the simulated signal. In this example, the actual frequency offset PHer-rl between the transmitter and the receiver is assumed to be 300 ppm. Since the clock recovery circuit 25 can not predict the actual frequency offset PHer-rl in advance, the ending of the recursive calibration is determined by comparing the accumulative correction offset PHacc of two successive calibration intervals. In other words, the calibration procedure compares a first accumulative correction offset PHacc corresponding to the previous time window and a second accumulative correction offset PHacc corresponding to the current time window. If the difference between the two estimated values of the accumulative correction offset PHacc is smaller than the predetermined difference threshold PHacc_th (for example, 1 ppm), the predetermined condition is determined met and the recursive calibration completes.

The meaning of the bar corresponding to the calibration interval Tcal(0) is described now. In the embodiment, the calibration interval Tcal(0) is considered as an initial calibration interval Tcal_int, and the time window corresponding to the initial calibration interval Tcal_int is defined as an initial time window. The initial calibration performed during the initial calibration interval Tcal_int corresponds to the step S303a in FIG. 5. During the initial calibration interval Tcal_int, the phase detector 251 and the loop filter 253 are enabled, but the free wheel circuit 257 and the skip circuit 258 are disabled. Therefore, during the initial calibration interval Tcal_int, the output circuit 259 only receives the pulse from the loop filter 253, not from the free wheel circuit 257 nor the skip circuit 258.

At the ending of the initial calibration interval Tcal_int, the controller 255 calculates the accumulative correction offset PHacc(1) according to the pulse generated by the output circuit 259. The accumulative correction offset PHacc(1) is 50.2 ppm in this example. Thus, in FIG. 6, the bar without hatched pattern corresponding to the initial calibration interval Tcal_int represents the accumulative correction offset PHacc(1)=50.2 ppm. As indicated by the arrow, the accumulative correction offset PHacc(1) calculated by the controller 255 is used in the calculation for the calibration interval Tcal(1).

Before the calibration interval Tcal(1), only the phase detector 251 and the loop filter 253 are enabled to calibrate the frequency offset. Therefore, the accumulative correction offset PHacc(1) is equal to the loop correction offset PHlp(0) of the initial calibration interval Tcal_int generated by the phase detector 251 and the loop filter 253.

Then, the meaning of the bar corresponding to the calibration interval Tcal(1) is described now. Just before the calibration interval Tcal(1), the controller 255 generates the free wheel control signal CTRLfw to enable the free wheel circuit 257 and informs the free wheel circuit 257 of the accumulative correction offset PHacc(1). The free wheel circuit 257 is enabled to periodically compensate the phase difference during the calibration interval Tcal(1) according to the accumulative correction offset PHacc(1). Therefore, the bar with hatched pattern corresponds to the calibration interval Tcal(1) represents the calibrated frequency offset in response to the free wheel pulse PLSfw which is generated by the free wheel circuit 257 according to the accumulative correction offset PHacc(1).

If one clock cycle of the local clock signal CLKloc is divided into 128 phase steps, each phase step PHstep corresponds to 7812.5 ppm. By considering the accumulative correction offset PHacc(1), each clock cycle of the local clock signal CLKloc includes a phase difference of at least 50.2 ppm resulting from the frequency offset. After certain clock cycles, the phase difference (multiple of the accumulative correction offset PHacc(1)) resulting from the frequency offset will reach or exceed one phase step PHstep.

Therefore, during the calibration interval Tcal(1) (that is, the current time window), the free wheel circuit 257 should automatically generate one free wheel pulse PLSfw once the phase difference resulting from the frequency offset reaches or exceeds one phase step (that is, 7812.5 ppm) after certain clock cycles. The free wheel circuit 257 will generate and transmit the free wheel pulse PLSfw to the output circuit 259 every 155 or 156 clock cycles (7812.5 ppm/50.2 ppm≈155.6) during the calibration interval Tcal(1) to partially calibrate the frequency offset.

At the ending of the calibration interval Tcal(1), the controller 255 calculates the accumulative correction offset PHacc(2) according to the Equation (1), obtaining 120.5 ppm in this example. Since all of the phase detector 251, the loop filter 253 and the free wheel circuit 257 have been enabled during the calibration interval Tcal(1), the phase-shift pulse is generated based on the loop pulse PLSlp and the free wheel pulse PLSfw. In other words, the accumulative correction offset PHacc(2) forms by cooperation of the phase detector 251, the loop filter 253 and the free wheel circuit 257.

As described above, the free wheel pulse PLSfw is generated according to the accumulative correction offset PHacc(1) calculated in the previous time window (that is, calibration interval Tcal_int in this example). Hence, the difference between the accumulative correction offset PHacc(1) and the accumulative correction offset PHacc(2) results from the loop pulse PLSlp generated by the loop filter 253. According to the difference between the accumulative correction offset PHacc(1) and the accumulative correction offset PHacc(2), the loop correction offset PHlp(1) corresponding to the calibration interval Tcal(1) contributed by the operation of the phase detector 251 and the loop filter 253 is obtained. The bar without hatched pattern corresponding to the calibration interval Tcal(1) in FIG. 6 represents to the loop correction offset PHlp(1), that is, PHlp(1)=PHacc(2)−PHacc(1)=70.3 ppm in this example.

Theoretically, the residual frequency offset PHrm of the calibration interval Tcal(1) should be 249.8 ppm (300 ppm−50.2 ppm=249.8 ppm) after removing the accumulative correction offset PHacc(1) compensated by the free wheel circuit 257. Ideally, the loop correction offset PHlp(1) contributed by the operation of the phase detector 251 and the loop filter 253 should be 249.8 ppm. However, the phase detector 251 may not accurately estimate the actual residual frequency offset PHrm (249.8 ppm) in the calibration interval Tcal(1), but obtain 70.3 ppm as the loop correction offset PHlp(1).

At the ending of the calibration interval Tcal(1), the difference between the accumulative correction offset PHacc(1) and the accumulative correction offset PHacc(2) is still greater than the predetermined difference threshold PHacc_th (1 ppm). Thus, the recursive calibration continues after the calibration interval Tcal(1). As indicated by the arrow, the controller 255 estimates, in the calibration interval Tcal(1), that the accumulative correction offset PHacc(2) is 120.5 ppm. The accumulative correction offset PHacc(2) is used in the calculation for next calibration interval Tcal(2).

Then, the meaning of the bar corresponding to the calibration interval Tcal(2) is described now. The bar with hatched pattern corresponding to the calibration interval Tcal(2) represents the calibrated frequency offset in response to the free wheel pulse PLSfw which is generated by the free wheel circuit 257 according to the accumulative correction offset PHacc(2). Just before the calibration interval Tcal(2), the controller 255 informs the free wheel circuit 257 of the accumulative correction offset PHacc(2). Thus, the free wheel circuit 257 periodically compensates the phase difference during the current time window (calibration interval Tcal(2)) according to the accumulative correction offset PHacc(2) obtained in the previous time window (calibration interval Tcal(1)).

Since the phase detector 251, the loop filter 253 and the free wheel circuit 257 have been enabled before the calibration intervals Tcal(2), the accumulative correction offset PHacc(2) estimated by the controller 255 just before the calibration interval Tcal(2) includes the loop correction offset PHlp(1) obtained in the calibration interval Tcal(1) contributed by the operation of the phase detector 251 and the loop filter 253 and the accumulative correction offset PHacc(1) used by the free wheel phase 257 during the calibration interval Tcal(1).

At this time, by considering the accumulative correction offset PHacc(2), each clock cycle of the local clock signal CLKloc includes a phase difference of at least 120.5 ppm resulting from the frequency offset. After certain clock cycles, the phase difference (multiple of the accumulative correction offset PHacc(2)) resulting from the frequency offset will reach or exceed one phase step PHstep.

Therefore, during the calibration interval Tcal(2) (that is, the current time window), the free wheel circuit 257 should automatically generate one free wheel pulse PLSfw once the phase difference resulting from the frequency offset reaches or exceeds one phase step (that is, 7812.5 ppm) after certain clock cycles. The free wheel circuit 257 will generate the free wheel pulse PLSfw every 64 or 65 clock cycles (7812.5 ppm/120.5 ppm≈64.8) during the calibration interval Tcal(2) to partially calibrate the frequency offset.

At the ending of the calibration interval Tcal(2), the accumulative correction offset PHacc(3) is calculated according to the Equation (1), obtaining 250.7 ppm in this example. Theoretically, the residual frequency offset PHrm of the calibration interval Tcal(2) should be 179.5 ppm (300 ppm−120.5 ppm=179.5 ppm) after removing the accumulative correction offset PHacc(2) compensated by the free wheel circuit 257. At this time, the residual frequency offset PHrm is still too great so that the phase detector 251 can not accurately estimate the actual residual frequency offset PHrm (179.5 ppm) in the calibration interval Tcal(2). The loop correction offset PHlp(2) obtained in the calibration interval Tcal(2) contributed by the operation of the phase detector 251 and the loop filter 253 is 130.2 ppm according to the difference between the accumulative correction offset PHacc(2) and the accumulative correction offset PHacc(3). The bar without hatched pattern corresponding to the calibration interval Tcal(2) in FIG. 6 represents the loop correction offset PHlp(2).

At the ending of the calibration interval Tcal(2), the difference between the accumulative correction offset PHacc(2) and the accumulative correction offset PHacc(3) is still greater than the predetermined difference threshold PHacc_th. Thus, the recursive calibration continues after the calibration interval Tcal(2). As indicated by the arrow, the controller 255 estimates, in the calibration interval Tcal(3), that the accumulative correction offset PHacc(3) is 250.7 ppm. The accumulative correction offset PHacc(2) is used in the calculation for the next time window (calibration interval Tcal(3)).

Similarly, the free wheel circuit 257 periodically compensates the phase difference during the calibration interval Tcal(3) according to the accumulative correction offset PHacc(3). The free wheel circuit 257 will generate the free wheel pulse PLSfw every 31 or 32 clock cycles (7812.5 ppm/250.7 ppm≈31.2) during the calibration interval Tcal(3) to partially calibrate the frequency offset. The phase detector 251 and the loop filter 253 also introduces new loop correction offset PHlp(3) in the calibration interval Tcal(3). If the controller 255 estimates, in the calibration interval Tcal(3), that the accumulative correction offset PHacc(4) is 298.1 ppm, it is obtained that the loop correction offset PHlp(3) in the calibration interval Tcal(3) is 47.4 ppm. The bar corresponding to the calibration interval Tcal(3) includes two portions, wherein the bar with hatched pattern represents the phase difference (250.7 ppm) compensated by the free wheel circuit 257 according to the accumulative correction offset PHacc(3); and the bar without hatched pattern corresponds to the loop correction offset PHlp(3) (47.4 ppm).

Just before the ending of the calibration interval Tcal(3), the difference between the accumulative correction offset PHacc(3) and the accumulative correction offset PHacc(4) is still greater than the predetermined difference threshold PHacc_th. Thus, the recursive calibration continues after the calibration interval Tcal(3). As indicated by the arrow, the controller 255 estimates, in the calibration interval Tcal(3), that the accumulative correction offset PHacc(4) is 298.1 ppm. The accumulative correction offset PHacc(4) is used in the calculation for the calibration interval Tcal(4).

The free wheel circuit 257 periodically compensates the phase difference during the calibration interval Tcal(4) according to the accumulative correction offset PHacc(4). The free wheel circuit 257 will generate the free wheel pulse PLSfw every 26 or 27 clock cycles (7812.5 ppm/298.1 ppm≈26.2) during the calibration interval Tcal(4) to partially calibrate the frequency offset. The phase detector 251 and the loop filter 253 also introduces new loop correction offset PHlp(4) in the calibration interval Tcal(4). The controller 255 estimates, in the calibration interval Tcal(4), that the accumulative correction offset PHacc(5) is 299.5 ppm in the example. In FIG. 6, the bar with hatched pattern represents the phase difference (298.1 ppm) compensated by the free wheel circuit 257 according to the accumulative correction offset PHacc(4), and the bar without hatched pattern represents the loop correction offset PHlp(4) (1.4 ppm).

At this time, since the difference between the accumulative correction offset PHacc(4) and the accumulative correction offset PHacc(5) is still greater than the predetermined difference threshold PHacc_th, the recursive calibration continues after the calibration interval Tcal(4). As indicated by the arrow, the controller 255 estimates, in the calibration interval Tcal(4), that the accumulative correction offset PHacc(5) is 299.5 ppm. The accumulative correction offset PHacc(5) is used in the calculation for the calibration interval Tcal(5).

Similar to the calibration intervals Tcal(1)~Tcal(4), the free wheel circuit 257 periodically compensates the phase difference during the calibration interval Tcal(5) according to the accumulative correction offset PHacc(5). The free wheel circuit 257 will generate the free wheel pulse PLSfw every 26 or 27 clock cycles (7812.5 ppm/299.5 ppm≈26.1) during the calibration interval Tcal(5) to partially calibrate the frequency offset. The phase detector 251 and the loop filter 253 also introduces new loop correction offset PHlp(5) in the calibration interval Tcal(5). The controller 255 estimates, in the calibration interval Tcal(5), that the accumulative correction offset PHacc(6) is 300.1 ppm in the example. The bar corresponding to the calibration interval Tcal(5) includes the bar with hatched pattern representing the phase difference (299.5 ppm) compensated by the free wheel circuit 257 according to the accumulative correction offset PHacc(5), and the bar without hatched pattern represents the loop correction offset PHlp(5) (0.6 ppm). Just before or at the ending of the calibration interval Tcal(5), the controller 255 decides that the difference between the accumulative correction offset PHacc(5) and the accumulative correction offset PHacc(6) is smaller than the predetermined difference threshold PHacc_th. At this time, the predetermined condition is met. Thus, the recursive calibration terminates after the calibration interval Tcal(5). The recursive calibration goes through the calibration intervals Tcal(1)~Tcal(5), and corresponds to the step S303b and the step S303c in FIG. 5. Hence, the subsequent calibration interval Tcal(6) is considered as the final calibration interval Tcal_lst.

From the above description, the free wheel circuit 257 in the embodiments generates the free wheel pulse after certain clock cycles, and the number of the certain clock cycles satisfies the condition that the overall phase difference of the certain clock cycles reaches or exceeds one phase step. The number of the clock cycles is not a constant value.

The bar corresponding to the final calibration interval Tcal_last only includes the bar with hatched pattern. The bar with hatched pattern represents the phase difference compensated by the free wheel circuit 257 during the final calibration interval Tcal_lst according to the accumulative correction offset PHacc(6) (300.1 ppm). The free wheel circuit 257 will generate the free wheel pulse PLSfw every 26 or 27 clock cycles (7812.5 ppm/300.1 ppm≈26.03) during the calibration interval Tcal(6) to partially calibrate the frequency offset. Before entering the final calibration interval Tcal_lst, the controller 255 generates a phase detector control signal CTRLpd to disable the phase detector 251. The control 255 controls the voltage level of the phase detector controlsignal CTRLpd to disable or enable the phase detector 251.

The time length of the final calibration interval Tcal_lst may be equal to or longer than the time length of one time window Ttw. The free wheel circuit 257 uses the same parameter (for example, the accumulative correction offset PHacc(6)) to periodically generate the free wheel pulse PLSfw during the whole final calibration interval Tcal_lst.

After the recursive calibration procedure, the clock recovery circuit 25 completes the calibration for the actual frequency offset PHer_rl. Subsequently, the phase detector 251 and the loop filter 253 need only to calibrate a small phase difference. In other words, the clock recovery circuit 25 can rapidly converge and enter in the stable state. Then, the controller 255 will adjust the equalizer 23 in the final calibration interval Tcal_lst to help the equalizer 23 rapidly converge and operate in the stable state too. Such calibration corresponds to the step S303d in FIG. 5, and will be described later with reference to FIG. 8.

When the equalizer 23 is adjusted in the final calibration interval Tcal_lst to converge and operate stably, the controller 255 generates the phase detector control signal CTRLpd to enable the phase detector 251 and terminate the final calibration interval Tcal_lst to finish the calibration method of frequency offset. After finishing the calibration method of frequency offset of the embodiment, the operation of the phase detector 251 and the free wheel circuit 257 of the physical layer circuit 20 continues. Thus, the free wheel circuit 257 generates the free wheel pulse PLSfw according to the final parameter (for example, the accumulative correction offset PHacc(6)), and the phase detector 251 continuously calibrates the small residual phase difference.

In another embodiment, the clock recovery circuit 25 may further decide whether to perform timeout operation (S321), as shown in FIG. 5. The timeout condition may relate to the number of the time windows passed during the recursive calibration. If the number of the time windows (calibration intervals) of the recursive calibration counting from the initial time window comes to a threshold number (for example, 32), and the difference between the last two values of the accumulative correction offset PHacc(31) and PHacc(32) is still greater than the predetermined difference threshold PHacc_th, the timeout condition is met. Fulfillment of the timeout condition represents that the loop correction offset PHlp contributed by the phase detector 251 and the loop filter 253 does not converge, but oscillate in a phase error range. Under this circumstance, in an embodiment, a predefined estimated value is used to improve the calibration of the frequency offset.

For purpose of illustration, it is assumed that the number of the calibration intervals reaches the threshold number at the ending of the current time window, and the difference between the last two estimated phase differences is still greater than the predetermined difference threshold PHacc_th. The controller 255 determines the accumulative correction offset PHacc of the last calibration interval (for example, PHacc(32)) as a timeout accumulative correction offset PHacc_tout.

Figure 7:
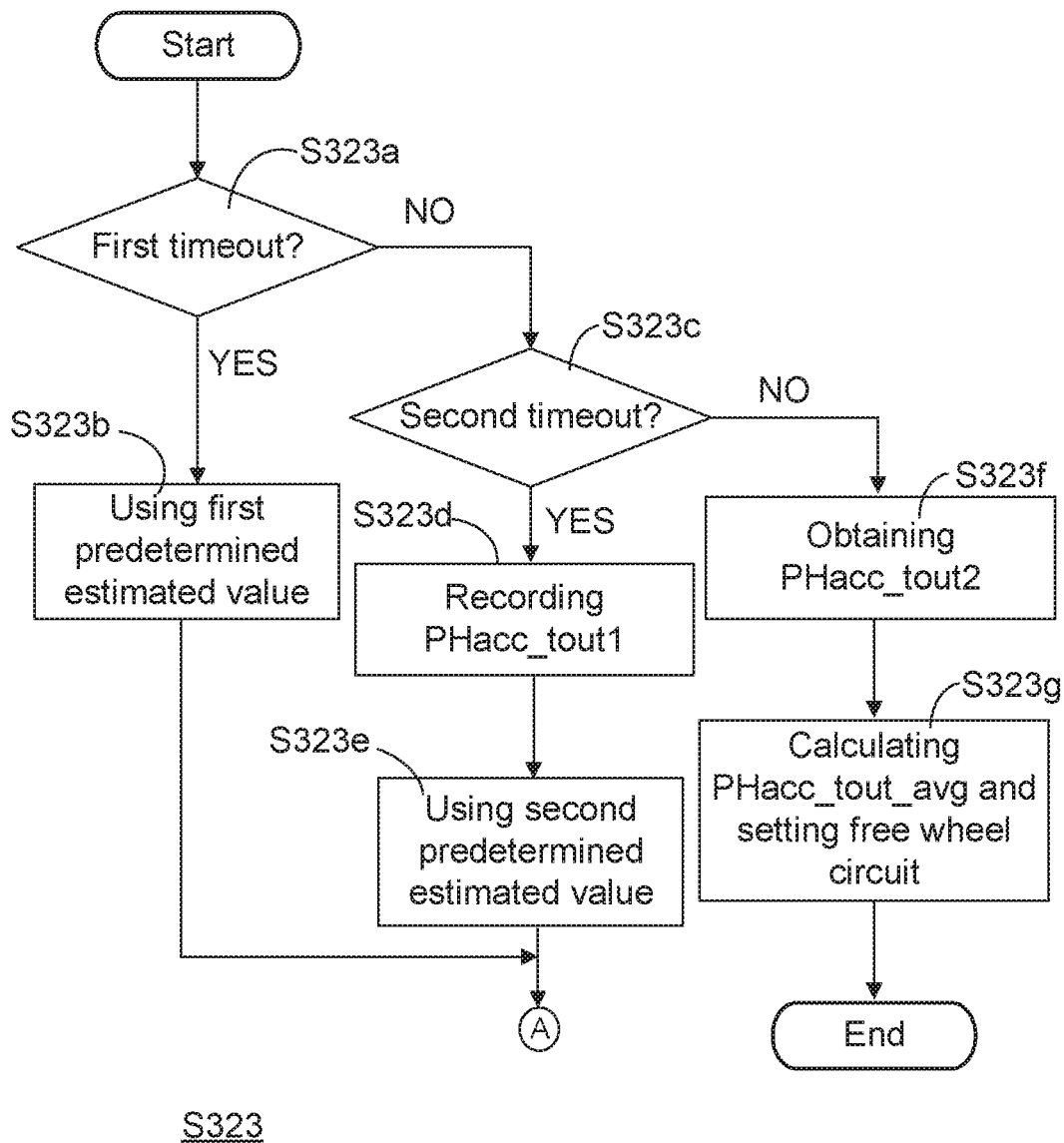
FIG. 7 is a flowchart illustrating the timeout operation in the calibration method of frequency offset according to another embodiment of the present invention.

The controller 255 controls the free wheel circuit 257 to perform the timeout operation (S323), and the flowchart is shown in FIG. 7. Firstly, the controller 255 determines whether it is the first timeout (S323a). If it is the first timeout, the controller 255 introduces a first predetermined estimated value to the free wheel circuit 257 (S323b). The first predetermined estimated value is a non-zero and large frequency offset value, for example, 150 ppm. Then, the procedure goes back to step S303b in FIG. 5 to perform a new round of recursive calibration (S303b) and to re-count the number of time windows during the new round of recursive calibration. That is, if the timeout event is the first timeout, during the first calibration interval after the first timeout (for example, Tcal(33)), the free wheel circuit 257 generates the free wheel pulses PLSfw based on the first predetermined estimated value rather than the accumulative correction offset PHacc (for example, PHacc(33)) estimated by the controller 255. Subsequently, the clock recovery circuit 25 continues to perform the recursive calibration (S303b).

Otherwise, if it is not the first timeout event, the controller 255 further determines whether the timeout event is the second timeout (S323c). If it is determined the second timeout, the controller 255 records the last accumulative correction offset PHacc obtained in the last calibration interval of the recursive calibration that has introduced the first predetermined estimated value. The recorded accumulative correction offset PHacc is called the first timeout accumulative correction offset PHacc_tout1 (S323d). Then, the controller 255 introduces a second predetermined estimated value to the free wheel circuit 257 (S323e). The second predetermined estimated value is a non-zero and large frequency offset value (for example, −150 ppm), which is a certain contrast to the first predetermined estimated value. Similarly, the procedure goes back to the step S303b in FIG. 5 to perform another round of recursive calibration and re-count the time windows again. That is, if the timeout event is the second timeout, during the first calibration interval (for example, Tcal(65)) after the second timeout, the free wheel circuit 257 generates free wheel pulses PLSfw based on the second predetermined estimation value rather than the accumulative correction offset PHacc (for example, PHacc(65)) estimated by the controller 255. Subsequently, the clock recovery circuit 25 continues to perform the recursive calibration (S303b).

If the decision in the step S323c is NO, it shows that neither the first predetermined estimated value nor the second predetermined estimated value can make the clock recovery circuit 25 converge. Thus, the controller 255 records the last accumulative correction offset PHacc obtained in the last calibration interval of the recursive calibration that has introduced the second predetermined estimated value. The recorded accumulative correction offset PHacc is called the second timeout accumulative correction offset PHacc_tout2 (S323f). Then, the controller 255 averages the first timeout accumulative correction offset PHacc_tout1 and the second timeout accumulative correction offset PHacc_tout2 to get an average timeout accumulative correction offset PHacc_tout_avg. The free wheel circuit 257 generates the free wheel pulse PLSfw according to the average timeout accumulative correction offset PHacc_tout_avg thereafter.

Because a wide actual frequency offset PHer-rl may be difficult to be accurately estimated by the clock recovery circuit 25 within an acceptable time period, a large predetermined value, such as the above-mentioned first predetermined estimated value, second predetermined estimated value, or average timeout accumulative correction offset PHacc_tout_avg, is provided to narrow the residual frequency offset. Therefore, the effectiveness of the phase detector 251 could be improved because the phase detector 251 may calculate phase differences more accurately with small residual frequency offset.

Figure 8:
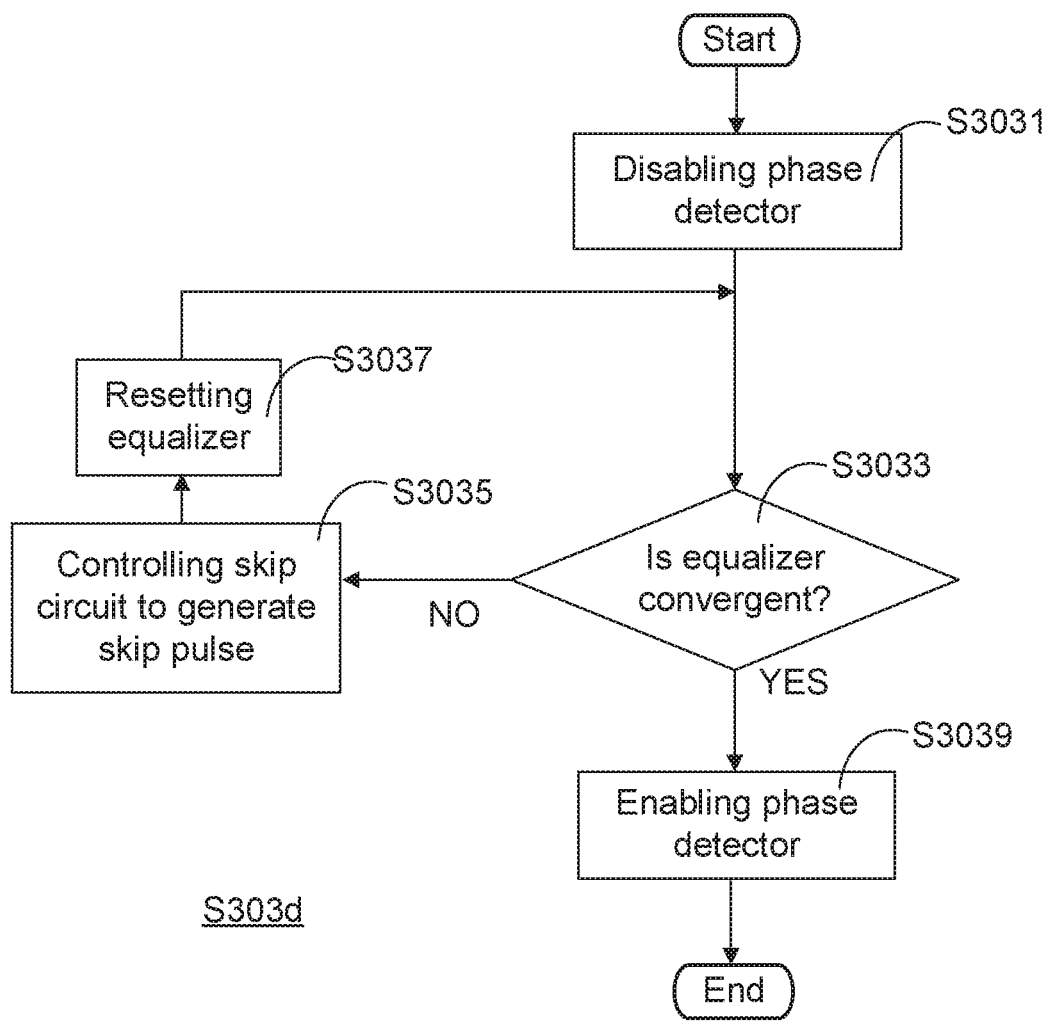
FIG. 8 is a flowchart illustrating the final calibration in the calibration method of frequency offset according to another embodiment of the present invention.

Please refer to FIG. 8, a flowchart illustrating the final calibration in the calibration method of frequency offset according to another embodiment of the present invention. The final calibration (S303d) is subsequent to the recursive calibration (S303b). After the clock recovery circuit 25 finishes the calibration on the actual frequency offset PHer-rl, a phase search procedure for the equalizer 23 starts to find the phase rendering the equalizer 23 convergent. Further, the controller 255 can check the convergence state of the equalizer 23 according to the setting of the clock recovery circuit 25.

Firstly, as described above, the clock recovery circuit 25 disables the phase detector 251 in the final calibration interval (S3031). Only the free wheel circuit 257 is used to periodically generate the free wheel pulse PLSfw to calibrate the frequency offset according to the last accumulative correction offset PHacc obtained in the recursive calibration. Besides, the controller 255 monitors the posterior decision signal ak' and the locking signal LOCKeq from the equalizer 23 to decide whether the equalizer 23 converges successfully (S3033). If the controller 255 does not receive the locking signal LOCKeq or statistics of the posterior decision signal ak' shows that the equalizer 23 does not function normally after a waiting time (for example, one time window length or shorter), the controller 255 determines that the equalizer 23 does not converge. Then, the controller 255 controls the skip circuit 258 to generate and transmit the skip pulse PLSskp to the PLL circuit 27 through the output circuit 259 to select one shifted clock signal CLKsft as the new sampling clock signal CLKsam (S3035). The controller 255 also generates the equalizer reset signal RSTeq to reset the equalizer 23 (S3037). The equalizer 23 receives the new digital received signal Srv_d generated based on the new sampling clock signal CLKsam for further operation and output. Besides, the controller 255 keeps on monitoring the posterior decision signal ak' and the locking signal LOCKeq from the equalizer 23 (S3033). If the controller 255 receives the locking signal LOCKeq and the statistics of the posterior decision signal ak' shows that the equalizer 23 functions normally, the equalizer 23 converges under the current sampling clock signal CLKsam. Thus, the equalizer 23 can stably and accurately eliminate the channel interference in the digital received signal Srv_d so as to output accurate signal to the clock recovery circuit 25. At this time, the controller 255 may enable the phase detector 251 (S3039) to terminate the final calibration interval. The phase detector 251, the loop filter 253 and the free wheel circuit 257 of the clock recovery circuit 25 cooperate again to calibrate the frequency offset in real time. According to the concept of the present invention, the skip-lead pulse generated by the skip circuit 258 controls the PLL circuit 27 to select a shifted clock signal CLKsft with one phase ahead of the current sampling clock signal CLKsam as the new sampling clock signal CLKsam; and the skip-lag pulse generated by the skip circuit 258 controls the PLL circuit 27 to select a shifted clock signal CLKsft with one phase behind of the current sampling clock signal CLKsam as the new sampling clock signal CLKsam.

Figure 9:
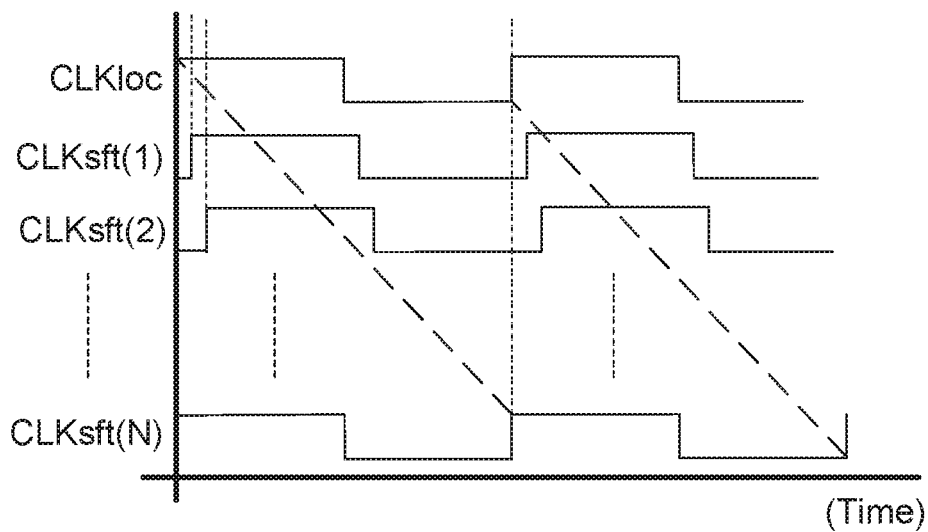
FIG. 9 is a waveform chart showing signals generated by the phase Interpolator of the physical layer circuit according to another embodiment of the present invention.

Please refer to FIG. 9, a waveform chart showing shifted signals generated by the phase Interpolator 271 according to the local clock signal CLKloc. Based on the local clock signal CLKloc, the phase interpolator 271 can generate a plurality of equally spaced shifted clock signals CLKsft(1)~CLKsft(N) of the same time period and sequentially delayed with a constant phase delay.

The number of the shifted clock signals CLKsft is determined according to the number of the phases that the phase interpolator 271 can provide. The more phases the phase interpolator 271 can provide, the smaller phase difference the phase step is corresponding to, and vice versa. If one clock period corresponds to 1,000,000 ppm and the phase interpolator 271 provides 64 equally spaced shifted clock signals CLKsft(1)~CLKsft(64), each clock period is divided into 64 identical phase steps, and each phase step PHstep corresponds to 15,625 ppm (i.e. 1/64 clock period). Similarly, if the phase interpolator provides 128 equally spaced shifted clock signals CLKsft(1)~CLKsft(128), each clock period is divided into 128 identical phase steps, and each phase step PHstep corresponds to 7,812.5 ppm (i.e. 1/128 clock period). In Equation (1), the number of the phase step N_step is the number of the shifted clock signals CLKsft provided by the phase interpolator 271.

When the PLL circuit 27 receives the phase-lead pulse PHadv or the phase-lag pulse PHret, a corresponding one of the N shifted clock signals CLKsft is selected as the new sampling clock signal CLKsam and transmitted to the ADC 21.

Figure 10:
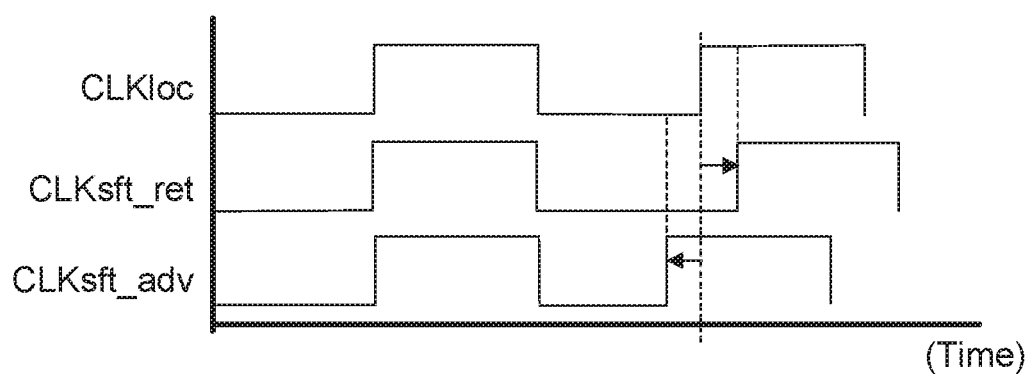
FIG. 10 is a waveform chart showing signals generated by the phase clock generator of the physical layer circuit according to another embodiment of the present invention.

Please refer to FIG. 10, a waveform chart showing the shifted clock signals generated by the phase clock generator in response to the phase-lead pulse PHadv and the phase-lag pulse PHret. The PLL circuit 27 includes the phase clock generator 273 and the phase interpolator 271. The phase clock generator 273 receives the shifted clock signals CLKsft from the phase interpolator 271 and selects one of them as the sampling clock signal CLKsam.

The phase clock generator 273 receives the phase-lead pulse PHadv and the phase-lag pulse PHret from the output circuit 259. As shown in FIG. 10, the first waveform represents the local clock signal CLKloc. The second waveform represents the shifted clock signal generated by the phase clock generator 273 in response to the phase-lag pulse PHret from the output circuit 259 wherein the rising edge of the second clock cycle is delayed with one phase step PHstep. The second cycle of the lag-shifted clock signal CLKsft_ret becomes longer. The third waveform represents the shifted clock signal generated by the phase clock generator 273 in response to the phase-lead pulse PHadv from the output circuit 259 wherein the rising edge of the second clock cycle of the shifted clock signal is one phase step PHstep ahead of the local clock signal CLKloc. The second cycle of the lead-shifted clock signal CLKsft_adv becomes shorter.

According to the above description, the clock recovery circuit of the present invention includes the free wheel circuit to rapidly compensate the phase difference resulting from the large frequency offset. Furthermore, the clock recovery circuit of the present invention further includes the skip circuit for timeout operation to make the operation of the clock recovery circuit more flexible. Accordingly, the clock recovery circuit of the present invention can rapidly converge and assisting in fast convergence of the equalizer. The physical layer circuit of the present invention is applicable to the Ethernet network, the Gigabit Ethernet network and the like.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A clock recovery circuit comprising:
   a phase detector, for receiving an equalized sampling signal generated by sampling based on a sampling clock signal to calculate a plurality of phase differences in a plurality of time windows;
   a loop filter electrically connected to the phase detector, for correspondingly generating a plurality of loop pulses in the time windows according to the phase differences;
   a free wheel circuit, for generating a plurality of free wheel pulses;
   an output circuit electrically connected to the loop filter and the free wheel circuit, for receiving the loop pulses and the free wheel pulses, and generating a plurality of phase-shifting pulses correspondingly; and
   a controller electrically connected to the free wheel circuit and the output circuit, for calculating a first accumulative correction offset according to the phase-shifting pulses generated by the output circuit in a previous time window of the time windows,
   wherein the free wheel circuit periodically generates the free wheel pulses during a current time window of the time windows according to the first accumulative correction offset, the current time window being next to the previous time window,
   wherein the sampling clock signal is adjusted according to the phase-shifting pulses generated by the output circuit.

2. The clock recovery circuit according to claim 1, wherein the previous time window is an initial time window, the free wheel circuit is disabled during the initial time window without generating the free wheel pulses, and the controller enables the free wheel circuit after the initial time window.

3. The clock recovery circuit according to claim 1, wherein the controller, is electrically connected to the phase detector, for calculating a second accumulative correction offset in the current time window according to the phase-shifting pulses, comparing a predetermined difference threshold with a difference between the first accumulative correction offset and the second accumulative correction offset, and generating a phase detector control signal to disable the phase detector and performing final calibration if the difference is not greater than the predetermined difference threshold.

4. The clock recovery circuit according to claim 3, further comprising a skip circuit electrically connected to the controller and the output circuit, for receiving at least one skip control signal generated by the controller in the final calibration to generate and transmit at least one skip pulse to the output circuit, wherein the output circuit correspondingly generates at least one of the phase-shifting pulses according to the at least one skip pulse.

5. The clock recovery circuit according to claim 4, wherein the controller generates the phase detector control signal to enable the phase detector and terminate the final calibration when the controller determines that an equalizer converges.

6. The clock recovery circuit according to claim 3, wherein the controller counts the number of time windows passed, the free wheel circuit periodically generates the free wheel pulses according to a predetermined estimated value in the time window next to the current time window if the counted number of the time windows reaches a threshold number and the difference is greater than the predetermined difference threshold at the ending of the current time window, and the controller re-counts the time windows since the time window next to the current time window.

7. The clock recovery circuit according to claim 6, wherein the controller counts a timeout number corresponding to a condition that the counted number of the time windows reaches the threshold number and the difference is greater than the predetermined difference threshold, the predetermined estimated value being a first predetermined estimated value when the timeout number is 1, the predetermined estimated value being a second predetermined estimated value when the timeout number is greater than 1, wherein the first predetermined estimated value is different from the second predetermined estimated value.

8. A physical layer circuit comprising:
  an equalizer, for equalizing a digital received signal generated by sampling based on a sampling clock signal, and generating an equalized sampling signal; and
  a clock recovery circuit, comprising:
  a phase detector, for receiving the equalized sampling signal to calculate a plurality of phase differences in a plurality of time windows;
  a loop filter electrically connected to the phase detector, for correspondingly generating a plurality of loop pulses in the time windows according to the phase differences;
  a free wheel circuit, for generating a plurality of free wheel pulses;
  an output circuit electrically connected to the loop filter and the free wheel circuit, for receiving the loop pulses and the free wheel pulses, and generating a plurality of phase-shifting pulses correspondingly; and
  a controller electrically connected to the free wheel circuit and the output circuit, for calculating a first accumulative correction offset according to the phase-shifting pulses generated by the output circuit in a previous time window of the time windows,
  wherein the free wheel circuit periodically generates the free wheel pulses during a current time window of the time windows according to the first accumulative correction offset, the current time window being next to the previous time window,
  wherein the sampling clock signal is adjusted according to the phase-shifting pulses generated by the output circuit.

9. The physical layer circuit according to claim 8, wherein the controller, is electrically connected to the phase detector, for calculating a second accumulative correction offset in the current time window according to the phase-shifting pulses, comparing a predetermined difference threshold with a difference between the first accumulative correction offset and the second accumulative correction offset, and generating a phase detector control signal to disable the phase detector and performing final calibration if the difference is not greater than the predetermined difference threshold.

10. The physical layer circuit according to claim 9, wherein the clock recovery circuit further comprises a skip circuit electrically connected to the controller and the output circuit, for receiving at least one skip control signal generated by the controller in the final calibration to generate and transmit at least one skip pulse to the output circuit, wherein the output circuit correspondingly generates the phase-shifting pulses according to the at least one skip pulse.

11. The physical layer circuit according to claim 10, wherein the controller determines whether the equalizer converges in the final calibration, and generating the skip control signal and an equalizer reset signal for resetting the equalizer if the equalizer does not converge after a waiting time, and then determining again whether the equalizer converges.

12. The physical layer circuit according to claim 8, wherein the equalizer further generates and transmits a plurality of posterior decision signals to the controller according to the digital received signal, and the controller generates an equalizer reset signal to reset the equalizer when the controller determines that the equalizer does not function normally according to the posterior decision signals.

13. A calibration method of frequency offset applied to a physical layer circuit of a receiver, the calibration method of frequency offset comprising steps of:
  equalizing a digital received signal generated by sampling based on a sampling clock signal to generate an equalized sampling signal;
  calculating a plurality of phase differences in a plurality of time windows according to the equalized sampling signal;
  generating a plurality of loop pulses correspondingly in the time windows according to the phase differences;
  periodically generating a plurality of free wheel pulses during a current time window of the time windows according to a first accumulative correction offset;
  generating a plurality of phase-shifting pulses correspondingly according to the loop pulses and the free wheel pulses; and
  adjusting the sampling clock signal according to the phase-shifting pulses,
  wherein the first accumulative correction offset is calculated according to the phase-shifting pulses generated in a previous time window prior to the current time window.

14. The calibration method of frequency offset according to claim 13, wherein the previous time window is an initial time window, and the free wheel pulses are not generated in the initial time window.

15. The calibration method of frequency offset according to claim 13, further comprising steps of:
  calculating a second accumulative correction offset according to the phase-shifting pulses generated in the current time window;
  comparing a predetermined difference threshold with a difference between the first accumulative correction offset and the second accumulative correction offset; and
  stopping calculating the phase differences and performing final calibration if the difference is not greater than the predetermined difference threshold.

16. The calibration method of frequency offset according to claim 15, further comprising steps of:
  determining whether an equalizer of the physical layer converges in the final calibration;
  terminating the final calibration and restarting to calculate the phase differences if the equalizer converges within a waiting time;
  generating a skip pulse and at least one of the phase-shifting pulses according to the skip pulse if the equalizer does not converge after the waiting time;
  generating an equalizer reset signal to reset the equalizer; and
  determining whether the equalizer converges again.

17. The calibration method of frequency offset according to claim 15, further comprising steps of:
  counting the number of time windows passed;
  periodically generating the free wheel pulses according to a predetermined estimated value in the time window next to the current time window if the counted number of the time windows reaches a threshold number and the difference is greater than the predetermined difference threshold at the ending of the current time window; and re-counting the time windows since the time window next to the current time window.

18. The calibration method of frequency offset according to claim 17, further comprising steps of:
counting a timeout number corresponding to a condition that the counted number of the time windows reaches the threshold number and the difference is greater than the predetermined difference threshold;
assigning a first predetermined estimated value to be the predetermined estimated value if the timeout number is 1; and
assigning a second predetermined estimated value to be the predetermined estimated value if the timeout number is greater than 1, the first predetermined estimated value being different from the second predetermined estimated value.

19. The calibration method of frequency offset according to claim 13, further comprising steps of:
generating a plurality of posterior decision signals according to the digital received signal; and
resetting an equalizer of the physical layer circuit when the equalizer does not function normally which is determined according to the posterior decision signals.

\* \* \* \* \*